United States Patent
Kim

(10) Patent No.: US 7,566,621 B2
(45) Date of Patent: Jul. 28, 2009

(54) METHOD FOR FORMING SEMICONDUCTOR DEVICE HAVING FIN STRUCTURE

(75) Inventor: Young Bog Kim, Gyeonggi-do (KR)

(73) Assignee: Hynix Semiconductor Inc., Icheon-si (KR)

( * ) Notice: Subject to any disclaimer, the term of this patent is extended or adjusted under 35 U.S.C. 154(b) by 72 days.

(21) Appl. No.: 11/411,864

(22) Filed: Apr. 27, 2006

(65) Prior Publication Data
US 2007/0155148 A1 Jul. 5, 2007

(30) Foreign Application Priority Data
Dec. 30, 2005 (KR) .................... 10-2005-0135233

(51) Int. Cl.
*H01L 21/336* (2006.01)
(52) U.S. Cl. .................. 438/270; 438/296; 438/589; 257/E21.546; 257/E21.585
(58) Field of Classification Search ................ 438/270, 438/297, 283, 259, 282, 268, 296, 424–426, 438/435, 587, 589, FOR. 221, FOR. 388, 438/FOR. 424, FOR. 458, FOR. 492; 257/E21.545, 257/E21.546, E21.585
See application file for complete search history.

(56) References Cited

U.S. PATENT DOCUMENTS

| | | | | | |
|---|---|---|---|---|---|
| 5,362,665 | A | * | 11/1994 | Lu | ............................. 438/253 |
| 5,372,960 | A | * | 12/1994 | Davies et al. | ............... 438/291 |
| 5,518,950 | A | * | 5/1996 | Ibok et al. | .................... 438/435 |
| 5,851,928 | A | * | 12/1998 | Cripe et al. | ................. 438/748 |
| 6,448,149 | B1 | * | 9/2002 | Lee et al. | .................... 438/424 |
| 6,455,912 | B1 | * | 9/2002 | Kim et al. | .................... 257/506 |
| 7,163,865 | B2 | * | 1/2007 | Kim | ............................ 438/270 |
| 2001/0025973 | A1 | * | 10/2001 | Yamada et al. | ............. 257/296 |
| 2004/0262687 | A1 | * | 12/2004 | Jung et al. | ................... 257/347 |
| 2005/0042833 | A1 | * | 2/2005 | Park et al. | ................... 438/282 |
| 2005/0173759 | A1 | * | 8/2005 | Kim et al. | .................... 257/331 |
| 2006/0234451 | A1 | * | 10/2006 | Slesazeck et al. | ........... 438/259 |
| 2007/0134878 | A1 | * | 6/2007 | Brask et al. | ................. 438/294 |
| 2009/0014810 | A1 | * | 1/2009 | Shin et al. | ................... 257/369 |

FOREIGN PATENT DOCUMENTS

| KR | 10-0506460 | 8/2005 |
|---|---|---|
| KR | 1020050079270 A | 8/2005 |

* cited by examiner

*Primary Examiner*—Matthew Smith
*Assistant Examiner*—Quovaunda Jefferson
(74) *Attorney, Agent, or Firm*—Townsend and Townsend and Crew LLP

(57) ABSTRACT

A method for forming a semiconductor device having a fin structure includes (a) forming a device isolation film over a silicon substrate to define an active area, (b) etching silicon substrate of gate forming region to form a trench, (c) selectively etching the device isolation film of a trench boundary, (d) forming a gate oxide film over the entire surface of the resulting structure, (e) depositing an electrode material over the entire surface of the resulting structure to form a gate electrode, and (f) forming a gate spacer over a sidewall of the gate electrode.

12 Claims, 9 Drawing Sheets

METHOD FOR FORMING SEMICONDUCTOR DEVICE HAVING FIN STRUCTURE

BACKGROUND OF THE INVENTION

1. Field of the Invention

The present invention generally relates to a method for forming a semiconductor device having a fin structure, and more specifically, to a method for forming a semiconductor device having a fin structure which comprises etching a silicon substrate with a recess gate mask and performing a selective etching process on a device isolation film having a double oxide film structure.

2. Description of the Related Art

A conventional method for forming a semiconductor device having a fin structure is performed as follows.

First, a device isolation oxide film is formed over a silicon substrate, and then ions are implanted into a cell region to form a well.

The silicon substrate of an active area is etched using a recess gate mask.

The device isolation oxide film is etched using a fin mask.

A gate oxide film is formed over the entire surface of the resulting structure.

A polysilicon layer, a tungsten silicide layer and a hard mask nitride film are deposited over the entire surface of the resulting structure to form a gate electrode.

Since the device isolation oxide film is over-etched using a fin mask to form a fin structure according to the conventional method, polysilicon in a dummy fin affects an active storage node, thereby degrading electric characteristics. Furthermore, since the recess gate mask and the fin mask are both used, the process is complicated, and accuracy is degraded.

SUMMARY OF THE INVENTION

Various embodiments of the present invention are directed at providing a method for forming a semiconductor device having a fin structure that comprises etching a silicon substrate using a recess gate mask and performing a selective etching process on a device isolation film having a double oxide film structure with a rapid oxide film etching speed and a slow oxide film etching speed, thereby simplifying the process and maximizing a current driving operation.

According to one embodiment of the present invention, a method for forming a semiconductor device having a fin structure includes (a) forming a device isolation film over a silicon substrate to define an active area; (b) etching the silicon substrate of a gate forming region of the active area to form a trench; (c) etching the device isolation film of an interface of the trench selectively; (d) forming a gate oxide film over the entire surface of the resulting structure; (e) depositing an electrode material over the entire surface of the resulting structure to form a gate electrode; and (f) forming a gate spacer over a sidewall of the gate electrode.

BRIEF DESCRIPTION OF THE DRAWINGS

Other aspects and advantages of the present invention will become apparent upon reading the following detailed description and with reference to the drawings in which.

DETAILED DESCRIPTION OF THE EXEMPLARY EMBODIMENTS

The present invention will be described in detail with reference to the accompanying drawings. Wherever possible, the same reference numbers will be used throughout the drawings to refer to the same or like parts.

Figure 1:
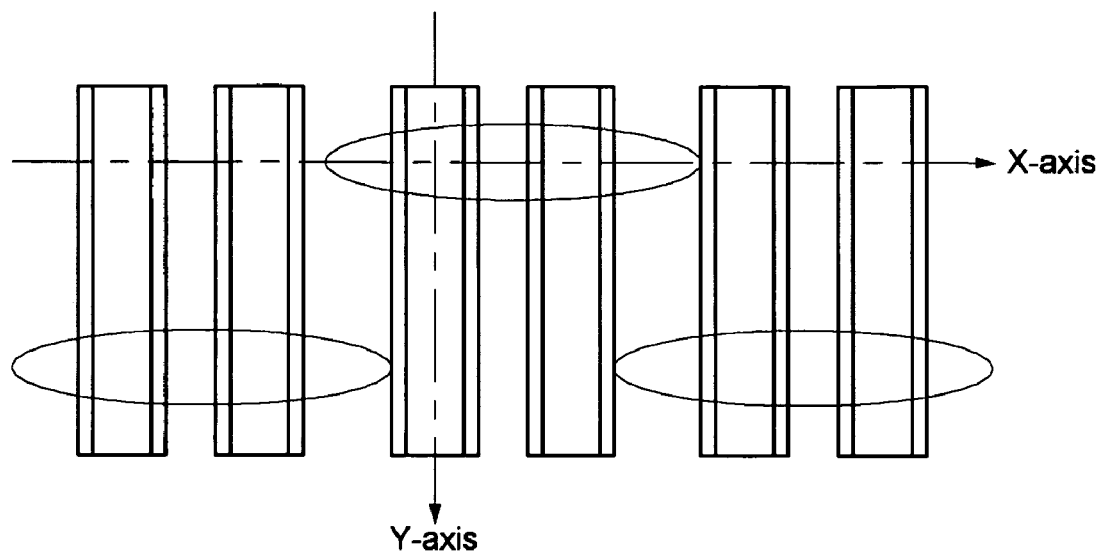
FIG. 1 is a plane diagram after forming a gate line of a semiconductor device having a fin structure according to an embodiment of the present invention.
Figure 2:
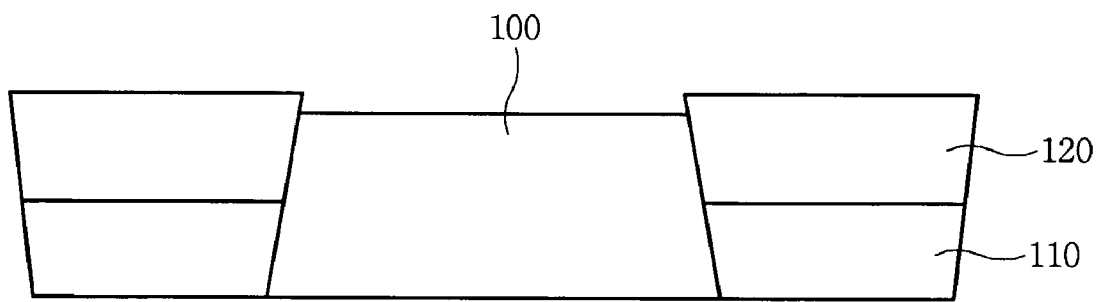
FIGS. 2 through 8b are cross-sectional diagrams illustrating a method for forming a semiconductor device having fin structure according to an embodiment of the present invention (herein, FIGS. 2, 3, 4a, 5a, 6a, 7 and 8a are cross-sectional diagrams in the X-axis direction shown in FIG. 1, and FIGS. 4b, 5b, 6b and 8b are cross-sectional diagrams in the Y-axis direction shown in FIG. 1)

Referring to FIG. 2, a region for forming a device isolation film over a silicon substrate is etched to define an active area 100, and a first oxide film 110 and a second oxide film 120 are sequentially deposited thereon to form a double oxide film.

Preferably, the thickness of the first oxide film (110) and the second oxide film (120) ranges from 300 to 3000 Å.

Preferably, the first oxide film 110 includes an oxide film having a rapid wet-etching speed, and the second oxide film 120 includes an oxide film having a slow wet-etching speed. Preferably, the oxide film having a rapid wet-etching speed includes a SOD (spin on dielectric) oxide film, and the oxide film having a slow wet-etching speed includes a HDP (high density plasma) oxide film.

Figure 3:
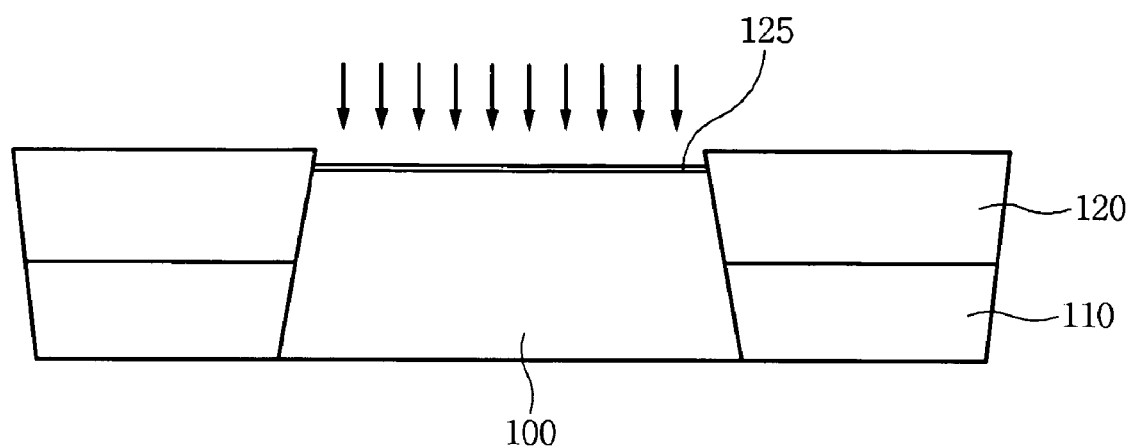

Referring to FIG. 3, an oxide film 125 is formed over the active area 100. Then, ions are implanted into the active area 100 of a cell region to form a well. Also, ions are implanted into peripheral regions to form a well. An oxide film 125 is used to prevent damage to the active area 100 resulting from the ion-implanting process. Preferably, the oxide film 125 has a thickness ranging from 30 to 300 Å.

Figure 4A:
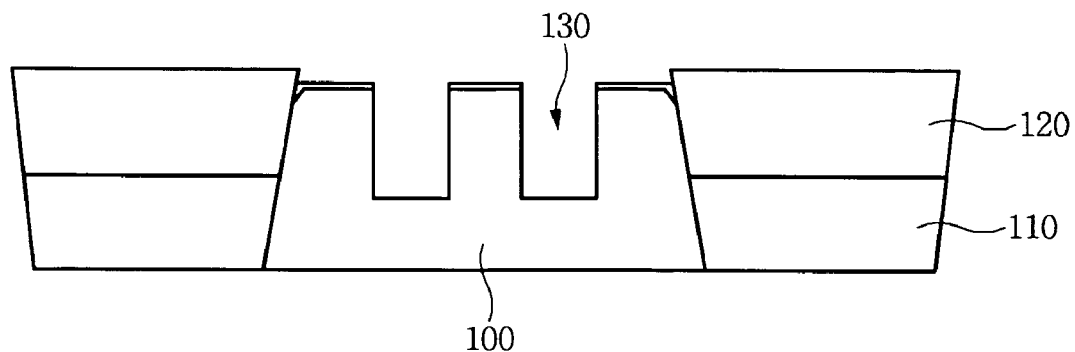
Figure 4B:
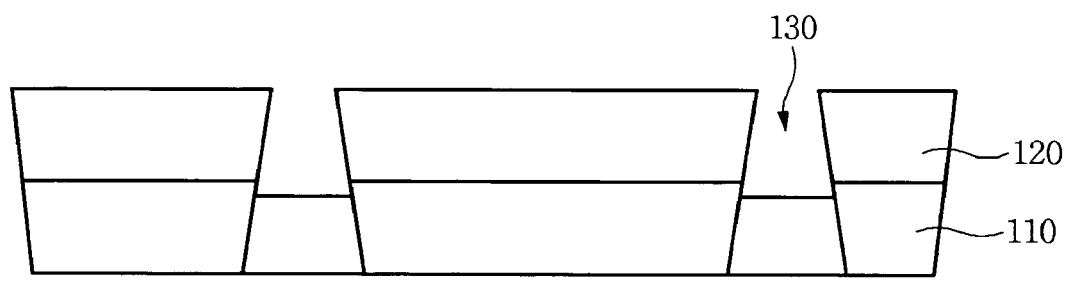

Referring to FIGS. 4a and 4b, a gate forming region of the silicon substrate active area 100 is etched using a recess gate mask to form a trench 130.

It is preferable that the etching step for forming the trench 130 is a dry-etching process.

As shown in FIG. 4b, the etching step for forming the trench 130 is preferably performed so as to expose the first oxide film 110, having a depth (i.e., removing a thickness of material) that ranges from 300 to 3000 Å.

Preferably, the bottom of the trench 130 has a square or round shape.

The formation of the trench 130 may enlarge a length of a source and a drain.

Figure 5A:
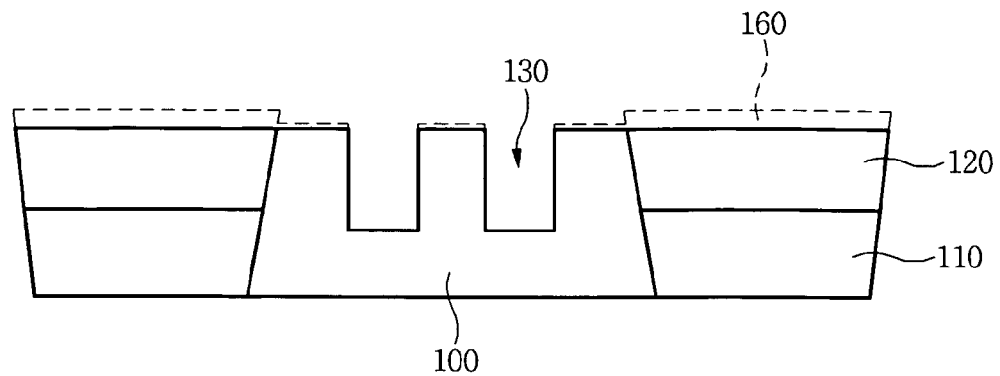
Figure 5B:
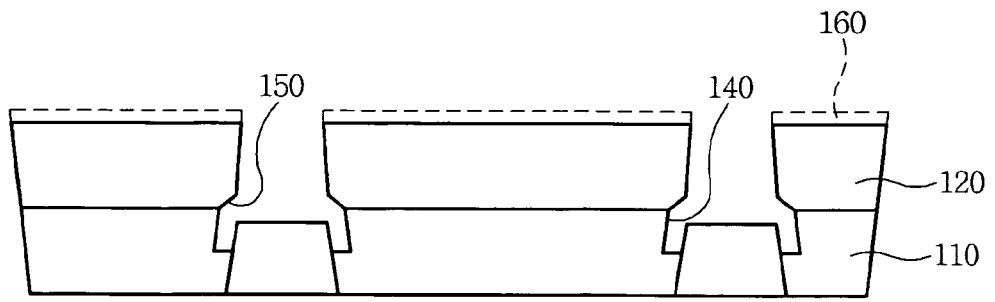

Referring to FIGS. 5a and 5b, a selective wet-etching process is performed on the device isolation film of the boundary of the trench 130 to form a saddle FIN architecture.

The saddle FIN structure refers to a structure where an active area has a recess gate structure in a direction perpendicular to gate line (X axis direction) and a fin structure that a gate oxide film and a gate electrode cover the active area in a gate line direction (Y axis direction).

As shown in FIG. 5b, the first oxide film 110 of the boundary of the trench 130 is selectively etched by the wet-etching process (removing material 140).

Then, a corner of the second oxide film 120 adjacent to the first oxide film 110 is etched (removing material 150) by the wet-etching process.

As shown in FIGS. 5a and 5b, the upper part of the second oxide film 120 and the upper oxide film 125 of the active area 100 are also etched a predetermined depth (i.e., removal of a predetermined thickness) by the wet-etching process (removing material 160).

Since the wet-etching speed of the first oxide film 110 is faster than that of the second oxide film 120, the first oxide film 110 is more etched than the second oxide film 120. The result is the opening 140 adjacent to the active area 100 shown in FIG. 5b.

It is preferable that the wet-etching process is performed so as to etch the first oxide film 110 to remove a thickness ranging from 100 to 1000 Å and to etch the second oxide film to remove a thickness ranging from 20 to 150 Å. Preferably, the wet-etching process is performed in a BOE or HF solution.

Figure 6A:
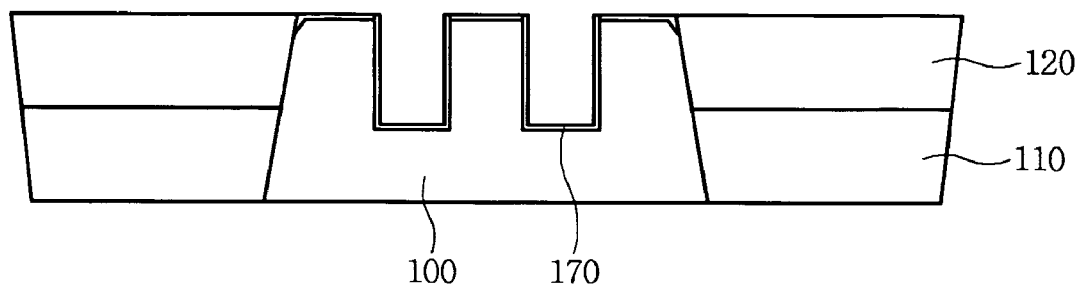
Figure 6B:
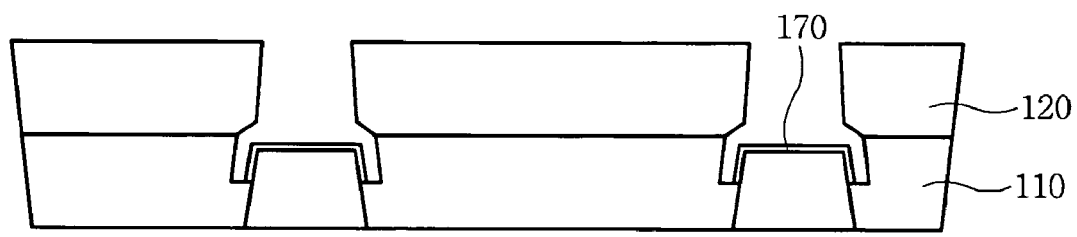

Referring to FIGS. 6a and 6b, a gate oxide film 170 is formed over the entire surface of the resulting structure.

Preferably, the thickness of the gate oxide film 170 ranges from 30 to 300 Å.

Figure 7:
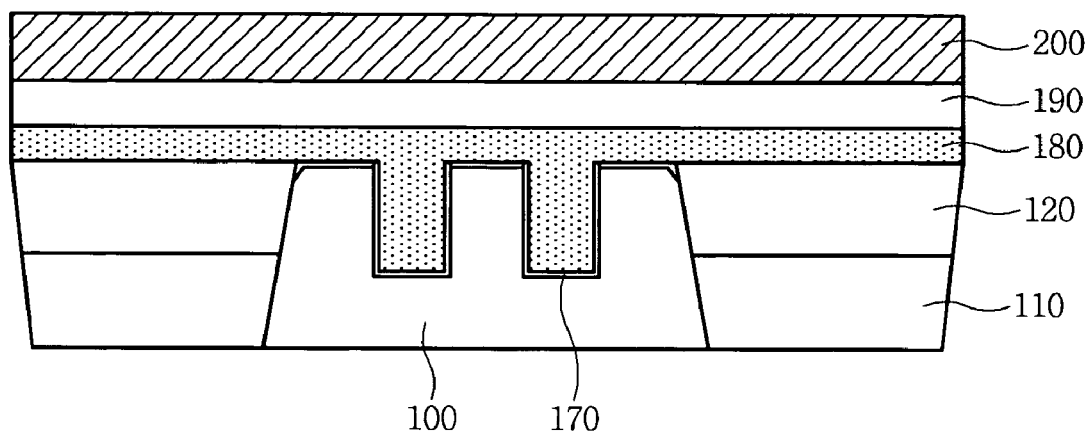

Referring to FIG. 7, a polysilicon layer 180, a tungsten silicide layer 190, and a hard mask nitride film 200 are sequentially deposited on the entire surface of the resulting structure to form a gate electrode.

A photoresist pattern is formed over the hard mask nitride film 200 to etch the hard mask nitride film 200. Then, the photoresist pattern is removed and the tungsten silicide layer 190 and the polysilicon layer 180 are etched with the remaining hard mask nitride film 200 pattern serving as a mask.

When the polysilicon layer 180 is etched, the gate oxide film 170 remains at a thickness ranging from 10 to 200 Å.

Preferably, the thickness of the polysilicon layer 180 ranges from 300 to 2000 Å, the thickness of the tungsten silicide layer 190 ranges from 200 to 2000 Å, and the thickness of the hard mask nitride oxide film 200 ranges from 300 to 2000 Å.

Figure 8A:
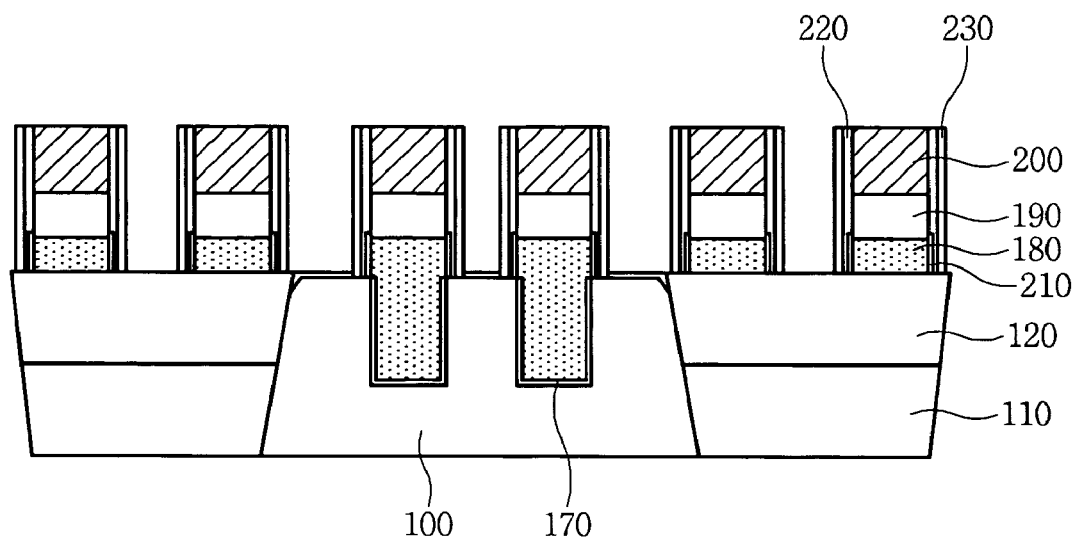
Figure 8B:
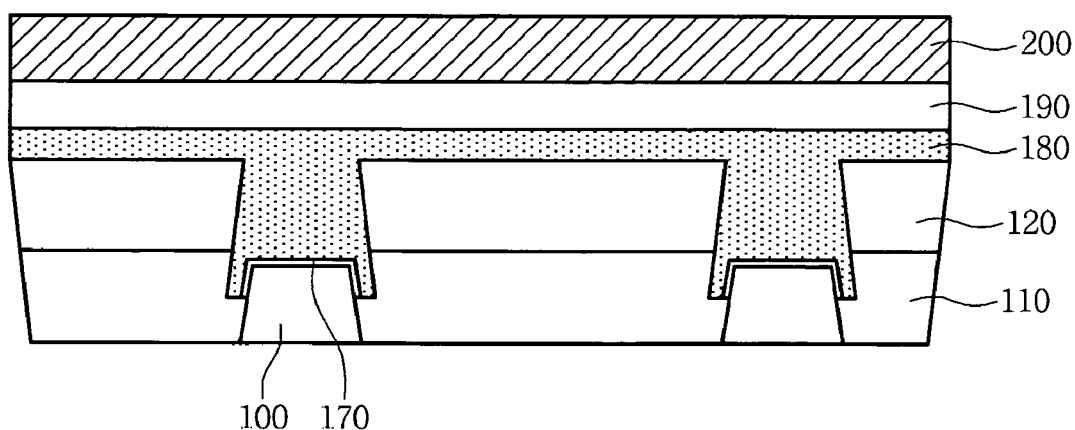

Referring to FIGS. 8a and 8b, a selective thermal oxide film 210 is formed over the sidewall of the exposed polysilicon layer 180 and the silicon substrate 100.

It is preferable that the thickness of selective thermal oxide film ranges from 20 to 200 Å.

A gate buffer oxide film 220 and a gate spacer nitride film 230 are sequentially deposited over and the entire surface of the resulting structure, and then etched to form a gate spacer.

It is preferable that the thickness of the gate buffer oxide film 220 ranges from 50 to 500 Å, and the thickness of the gate spacer nitride oxide film 230 ranges from 50 to 500 Å.

Figure 9A:
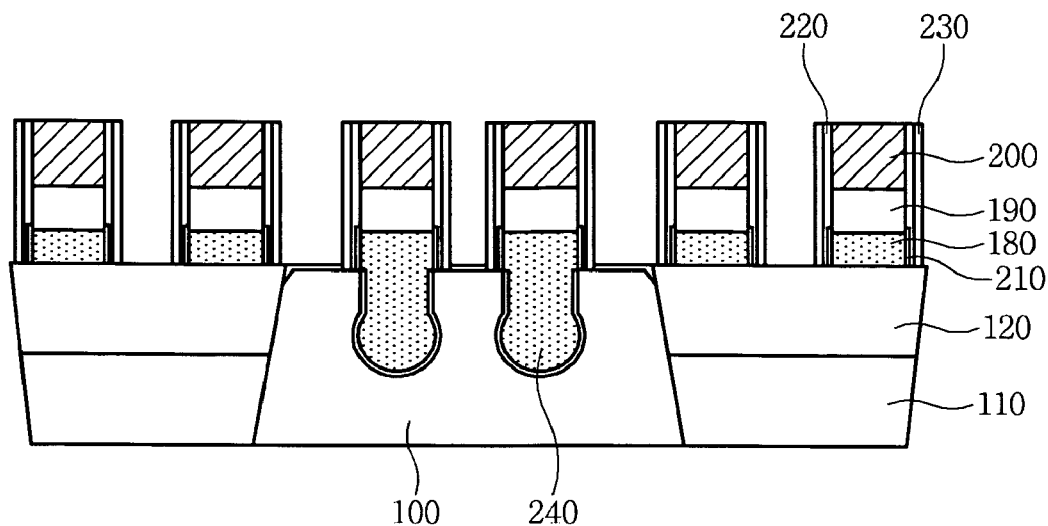
FIG. 9a and FIG. 9b are diagrams illustrating a method for forming a semiconductor device having fin structure according to another embodiment of the present invention.
Figure 9B:
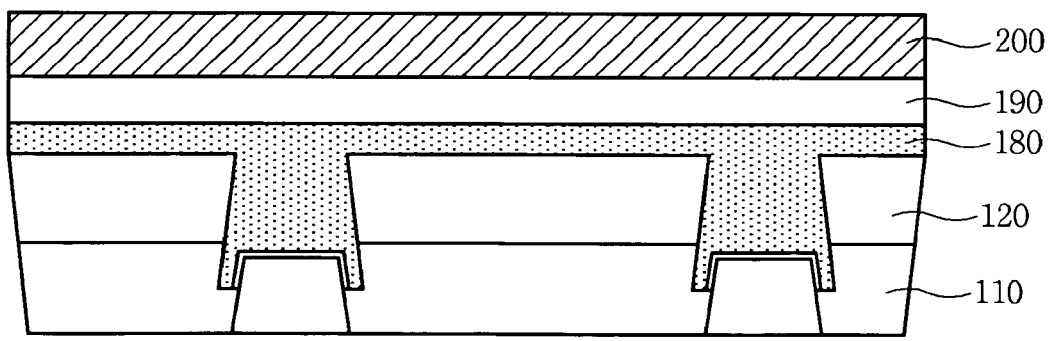

FIG. 9a and FIG. 9b are cross-sectional diagrams illustrating the method for forming a semiconductor device having a fin structure according to another embodiment of the present invention. FIG. 9a is a cross-sectional diagram in a X-axis direction, and FIG. 9b is a cross-sectional diagram in a Y-axis direction.

Referring to FIGS. 9a and 9b, although the structure is substantially similar to components described in reference to FIGS. 8a and 8b, the bottom of the trench 130 has a round shape 240.

As described above, in a method for forming a semiconductor device having a fin structure according to an embodiment of the present invention, a silicon substrate is etched with a recess gate mask, and a selective etching process is performed on a device isolation film having a double oxide film structure, thereby simplifying a process and preventing degradation of an active storage node. As a result, a fin structure is formed with an improved current driving operation of a device.

The foregoing description of various embodiments of the invention has been presented for purposes of illustration and description. It is not intended to be exhaustive or to limit the invention to the precise form disclosed, and modifications and variations are possible in light of the above teachings or may be acquired from practice of the invention. Thus, the embodiments were chosen and described in order to explain the principles of the invention and its practical application to enable one skilled in the art to utilize the invention in various embodiments and with various modifications as are suited to the particular use contemplated.

What is claimed is:

1. A method for forming a semiconductor device having a fin structure, the method comprising:
   (a) forming a device isolation film over a silicon substrate to define an active area, wherein the device isolation film has a double oxide film structure comprising a first oxide film and a second oxide film;
   (b) etching the silicon substrate of a gate forming region of the active area to form a trench;
   (c) selectively etching the device isolation film of a boundary of the trench, wherein the device isolation film is etched by wet-etching the first oxide film and the second oxide film, a wet-etching speed of the first oxide film being faster than a wet-etching speed of the second oxide film such that a saddle fin structure is formed;
   (d) forming a gate oxide film over the entire surface of the resulting structure;
   (e) depositing an electrode material over the entire surface of the resulting structure to form a gate electrode; and
   (f) forming a gate spacer over a sidewall of the gate electrode.

2. The method according to claim 1, wherein the thickness of the first oxide film and the second oxide film ranges from 300 to 3000 Å.

3. The method according to claim 1, wherein the first oxide film includes a SOD oxide film, and the second oxide film includes a HDP oxide film.

4. The method according to claim 1, wherein the etching of step (b) is a dry-etching process that is performed to a depth ranging from 300 to 3000 Å.

5. The method according to claim 1, wherein the bottom of the trench has a square or round shape.

6. The method according to claim 1, wherein the etching of step (c) is a wet-etching process performed to etch the first oxide film to remove a thickness ranging from 100 to 1000 Å and to etch the second oxide film to remove a thickness ranging from 20 to 150 Å.

7. The method according to claim 1, wherein the etching of step (c) is selectively performed depending on an etching speed difference between the first oxide film and the second oxide film.

8. The method according to claim 1, wherein the etching of step (c) is performed in a BOB or HF solution.

9. The method according to claim 1, wherein the thickness of the gate oxide film ranges from 30 to 300 Å.

10. The method according to claim 1 further comprising forming a selective thermal oxide film after step (e).

11. The method according to claim 10, wherein the selective thermal oxide film is formed over the sidewall of polysilicon layer and over the silicon substrate.

12. The method according to claim 10, wherein the thickness of the selective thermal oxide film ranges from 20 to 200 Å.

* * * * *